United States Patent
Kuila et al.

(10) Patent No.: US 9,362,948 B2
(45) Date of Patent: *Jun. 7, 2016

(54) SYSTEM, METHOD, AND COMPUTER PROGRAM PRODUCT FOR SAVING AND RESTORING A COMPRESSION/DECOMPRESSION STATE

(75) Inventors: Kaushik Kuila, San Jose, CA (US); Robert Laker, Fremont, CA (US)

(73) Assignee: Broadcom Corporation, Irvine, CA (US)

(*) Notice: Subject to any disclaimer, the term of this patent is extended or adjusted under 35 U.S.C. 154(b) by 1187 days.

This patent is subject to a terminal disclaimer.

(21) Appl. No.: 12/031,524

(22) Filed: Feb. 14, 2008

(65) Prior Publication Data

US 2009/0210437 A1 Aug. 20, 2009

(51) Int. Cl.
*G06F 17/30* (2006.01)
*H03M 7/30* (2006.01)
*H03M 7/40* (2006.01)
*H03M 7/46* (2006.01)

(52) U.S. Cl.
CPC ........... *H03M 7/40* (2013.01); *G06F 17/30067* (2013.01); *G06F 17/30115* (2013.01); *G06F 17/30153* (2013.01); *G06F 17/30324* (2013.01); *G06F 17/30516* (2013.01); *H03M 7/46* (2013.01); *H03M 7/607* (2013.01); *H03M 7/6041* (2013.01); *H03M 7/6058* (2013.01)

(58) Field of Classification Search
CPC ............... G06F 17/30153; G06F 17/30324; G06F 17/30067; G06F 17/30115; G06F 17/30; H03M 7/30; H03M 4/607; H03M 7/6041; H03M 7/55; H03M 7/6058

USPC ............... 707/609, 697, 693, 705, 813, 821; 710/68, 1; 711/170, 206, 165, 118, 711/154, 136, 162–164; 382/232–233, 235; 345/555, 557–558; 704/500; 717/175; 341/65, 87, 51
See application file for complete search history.

(56) References Cited

U.S. PATENT DOCUMENTS

| | | | | |
|---|---|---|---|---|
| 5,627,995 A | * | 5/1997 | Miller et al. | 711/171 |
| 5,675,789 A | * | 10/1997 | Ishii et al. | |
| 5,813,011 A | * | 9/1998 | Yoshida et al. | |
| 5,854,597 A | * | 12/1998 | Murashita et al. | 341/51 |
| 5,970,177 A | | 10/1999 | Chinnock | 382/244 |
| 6,012,062 A | * | 1/2000 | Jagadish et al. | |

(Continued)

FOREIGN PATENT DOCUMENTS

| | | | |
|---|---|---|---|
| EP | 1617417 | * | 1/2006 |
| WO | WO 02/093865 | * | 11/2002 |

OTHER PUBLICATIONS

Rahul Gupta et al."A Novel data compression algorithm for dynamic data"IEEE Region 8 Sibircon 2008, pp. 266-271.*

(Continued)

*Primary Examiner* — Srirama Channavajjala
(74) *Attorney, Agent, or Firm* — Sterne, Kessler, Goldstein & Fox P.L.L.C.

(57) ABSTRACT

A system, method, and computer program product are provided for saving and restoring a compression-decompression state. In operation, data is processed, the processing including compressing or decompressing the data. Additionally, a state of the processing is saved. Further, the state of the processing is restored.

21 Claims, 7 Drawing Sheets

(56) References Cited

U.S. PATENT DOCUMENTS

| | | | |
|---|---|---|---|
| 6,031,622 A * | 2/2000 | Ristow et al. | 358/1.11 |
| 6,131,192 A * | 10/2000 | Henry | 717/175 |
| 6,195,726 B1 * | 2/2001 | Hogan | 711/112 |
| 6,564,229 B1 * | 5/2003 | Baweja et al. | 707/741 |
| 6,587,583 B1 * | 7/2003 | Kurzweil et al. | 382/164 |
| 6,611,850 B1 * | 8/2003 | Shen | |
| 6,879,266 B1 * | 4/2005 | Dye et al. | 341/51 |
| 7,538,695 B2 * | 5/2009 | Laker et al. | 341/51 |
| 7,538,696 B2 * | 5/2009 | Laker et al. | 341/51 |
| 2001/0054131 A1 | 12/2001 | Alvarez, II et al. | 711/105 |
| 2002/0010819 A1 * | 1/2002 | Dye | 710/68 |
| 2002/0040413 A1 * | 4/2002 | Okada et al. | 710/68 |
| 2002/0063641 A1 | 5/2002 | Fish | 341/87 |
| 2002/0073298 A1 * | 6/2002 | Geiger et al. | 711/206 |
| 2004/0148303 A1 * | 7/2004 | McKay et al. | 707/101 |
| 2005/0114290 A1 * | 5/2005 | Borthakur et al. | 707/1 |
| 2005/0169465 A1 * | 8/2005 | Itani | 380/42 |
| 2007/0150497 A1 * | 6/2007 | De La Cruz et al. | 707/101 |
| 2007/0168320 A1 * | 7/2007 | Borthakur et al. | 707/1 |
| 2007/0174710 A1 * | 7/2007 | Duan et al. | 714/38 |
| 2007/0220220 A1 * | 9/2007 | Ziv et al. | 711/159 |
| 2007/0280543 A1 * | 12/2007 | Matsuhira | 382/233 |

OTHER PUBLICATIONS

Deutsch et al., "ZLIB Compressed Data Format Specification version 3.3," RFC 1950, May 1996.

Deutsch, "DEFLATE Compressed Data Format Specification version 1.3," RFC 1951, May 1996.

Deutsch, "GZIP file format specification version 4.3," RFC 1952, May 1996.

U.S. Appl. No. 11/849,166, filed Aug. 31, 2007.

Written Opinion and Search Report from PCT Application No. PCT/US08/08107 mailed on Jan. 30, 2009.

* cited by examiner

SYSTEM, METHOD, AND COMPUTER PROGRAM PRODUCT FOR SAVING AND RESTORING A COMPRESSION/DECOMPRESSION STATE

FIELD OF THE INVENTION

The present invention relates compressing or decompression, and more particularly to allocating resources during compression or decompression.

BACKGROUND

During the compression and decompression of incoming data (e.g. files, etc.), conventional systems typically compress and decompress each file on a first-arrived basis. For example, such systems may allocate all available resources to compress/decompress a first incoming file until such processing is finished, after which the system may allocate all available resources to compress/decompress a second incoming file, and so forth. Sometimes, in a situation where a particular file is large, a latency for processing the same may impose an unacceptable delay in processing subsequent files. In such situations, it is often desired to pause the processing of the larger file until later, so that resources may be first allocated to other smaller files, etc.

There is thus a need for addressing these and/or other issues associated with the prior art.

SUMMARY

A system, method, and computer program product are provided for saving and restoring a compression/decompression state. In operation, data is processed, the processing including compressing or decompressing the data. Additionally, a state of the processing is saved. Further, the state of the processing is restored.

DETAILED DESCRIPTION

Figure 1:
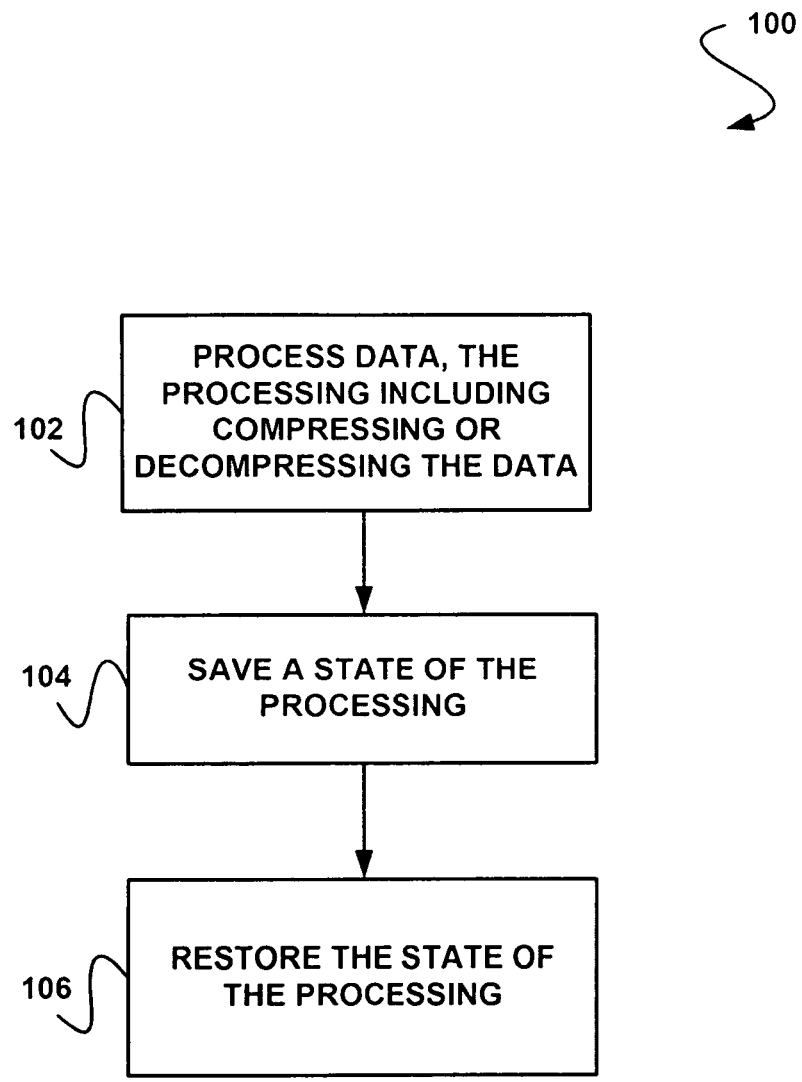
FIG. 1 shows a method for saving and restoring a compression-decompression state, in accordance with one embodiment.

FIG. 1 shows a method 100 for saving and restoring a compression/decompression state, in accordance with one embodiment. As shown, data is processed, the processing including compressing or decompressing the data. See operation 102.

In the context of the present description, compressing refers to any act of compressing data. For example, in various embodiments, the compressing may include, but is not limited to, implementing lossless data compression algorithms such as Lempel-Ziv algorithms (e.g. LZ77, LZ78, etc.), Lempel-Ziv-Welch (LZW) algorithms, Burrows-Wheeler transforms (BWT), implementing lossy data compression algorithms, and/or any other compression that meets the above definition. Furthermore, decompressing refers to any act of decompressing the data.

As shown further, a state of the processing is saved. See operation 104. In the context of the present description, a state refers to a condition of the processing. For example, in one embodiment, the state may include information associated with a status of the processing.

Further, the state of the processing is restored. See operation 106. As an option, at least a portion of the saving and at least a portion of the restoring may be carried out simultaneously.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
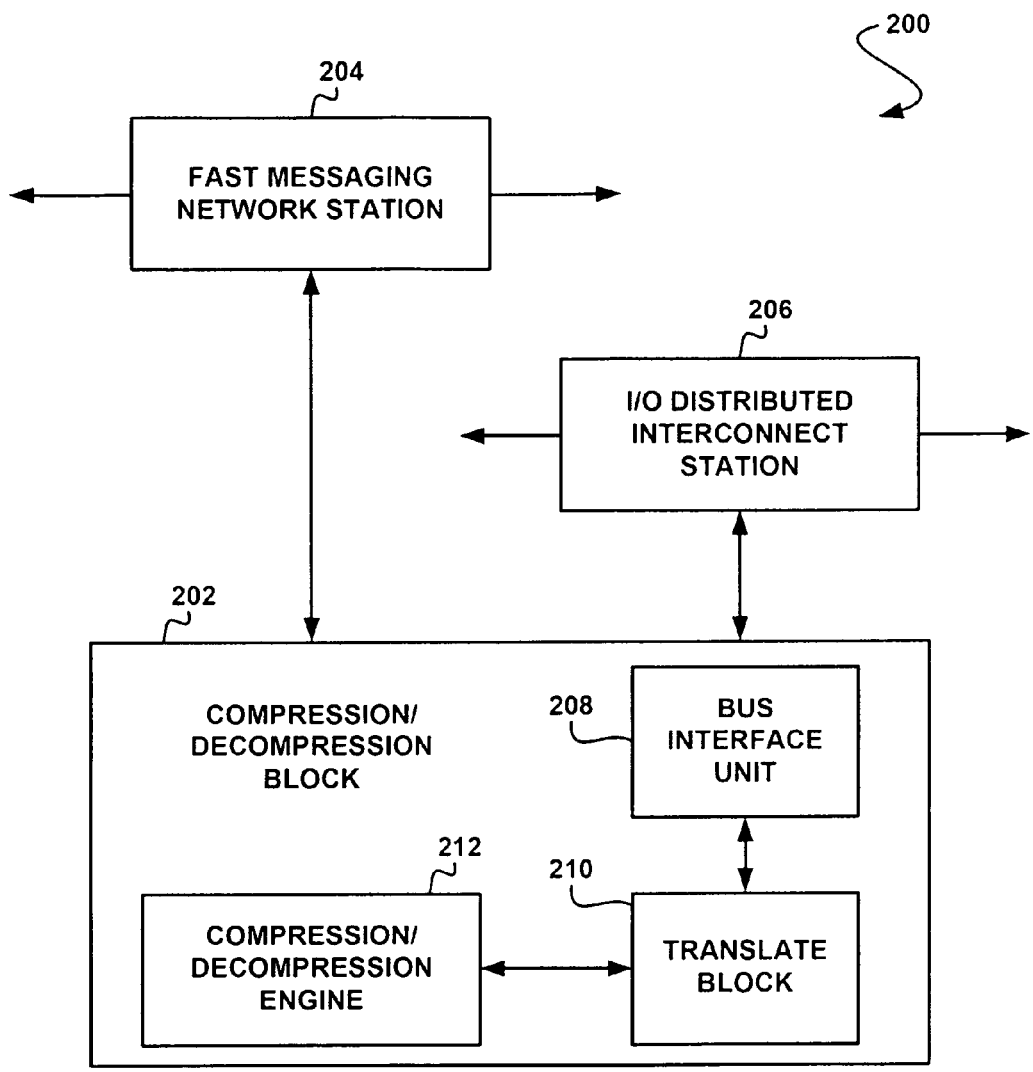
FIG. 2 shows a computing environment for saving and restoring a compression/decompression state, in accordance with one embodiment.

FIG. 2 shows a computing environment 200 for saving and restoring a compression/decompression state, in accordance with one embodiment. As shown, the computing environment 200 includes a compression/decompression block (CDB) 202, a fast messaging network (FMN) station 204, and an input-output (I/O) distributed interconnect station 206. In one embodiment, the I/O distributed interconnect station 206 may be part of a high speed distributed interconnect ring which connects multiple cores, caches, and processing agents. The high speed distributed interconnect ring may support simultaneous transactions among the connected components.

The FMN 204 provides a channel for messages directed to and from the CDB 202. In some embodiments, the messages may direct the CDB 202 to perform compression/decompression or indicate completion of a compression/decompression operation. In one embodiment, the CDB 202 is configured to compress files for transfer via a bus interface unit (BIU) 208 and to decompress compressed files received via the BIU 208. Alternatively, other embodiments of the CDB 202 may be implemented in other computing environments in which compressed files may be used.

As shown, the CDB 202 may include the BIU 208, a translate block (XLT) 210, and a compression/decompression engine (CDE) 212. The BIU 208 may provide a data interface to the i/O distributed interconnect station 206 and the I/O distributed interconnect ring. The XLT 210 may provide an interface between the BIU 208 and the CDE 212. In one embodiment, the XLT 210 may use its own direct memory access (DMA) engine to read and write data via the BIU 208, such that the XLT 210 may operate autonomously from a central processing unit (CPU) coupled to the computing environment 200.

In one embodiment, the CDE 212 may perform compression and decompression operations for the CDB 202. It should be noted that, in various other embodiments, the CDB 202 may include fewer or more components. Additionally, other embodiments of the CDB 202 may implement more or less functionality than is described herein.

In operation, software may provide free descriptors to the CDB 202 (e.g. at system start-up). In this case, free descriptors refer to any descriptor associated with a free page in memory. In one embodiment, these free descriptors may be in a buffer such as a FIFO buffer (e.g. a free descriptor pool FIFO buffer).

In various embodiments, this buffer may hold a various number of descriptors. For example, in one embodiment, the buffer may hold up to eight descriptors on chip and have the ability to be extended into memory. This spill region in the memory may be configured in the case that the CDB 202 is initialized with more than eight descriptors.

When a compression/decompression message is sent from the CPU to the CDB 102, the message may first be decoded and a list of data pointers may be retrieved from memory. In one embodiment, the first pointer in the list may point to a scratch page. As an option, this scratch page may be at least 1 Kbyte and be used by the CDB 202 to store intermediate results of a compression/decompression process.

In this way, a save and restore feature may be implemented, which allows the CDB 202 to store the intermediate state of a first file being processed and work on a second file. When more data for the first file is received, the state may be restored by using the restore feature. The XLT 210 may then walk down the list of data pointers fetching the data and sending it to the CDE 212.

The CDE 212 may then perform the transformations on the data (e.g. compressions/decompressions) and return the data back to the XLT 210. The XLT 210 may then pop two free descriptors from the buffer. In this case, the first free descriptor may be used for forming a return list. Additionally, the second descriptor may be the location where the transformed data is written.

If the data does not fit into a single descriptor, then more free descriptors may be popped from the buffer and used to store the data. When all the transformed data has been written to memory, the return message may be formed and sent to a "return bucket." In this case, the return bucket is a field in the message that was sent from the CPU to the CDB 202. Return buckets may be associated with CPUs in a multi-processor system.

For files that use the save/restore functionality, software may return free descriptors back to the CDB 202 after it has received a message and read the transformed data. It should be noted that, for files that use save/restore, free descriptors may not be sent back to the CDB 202 until the whole file is transformed, as following, segments might point back to data in previous segments.

Figure 3:
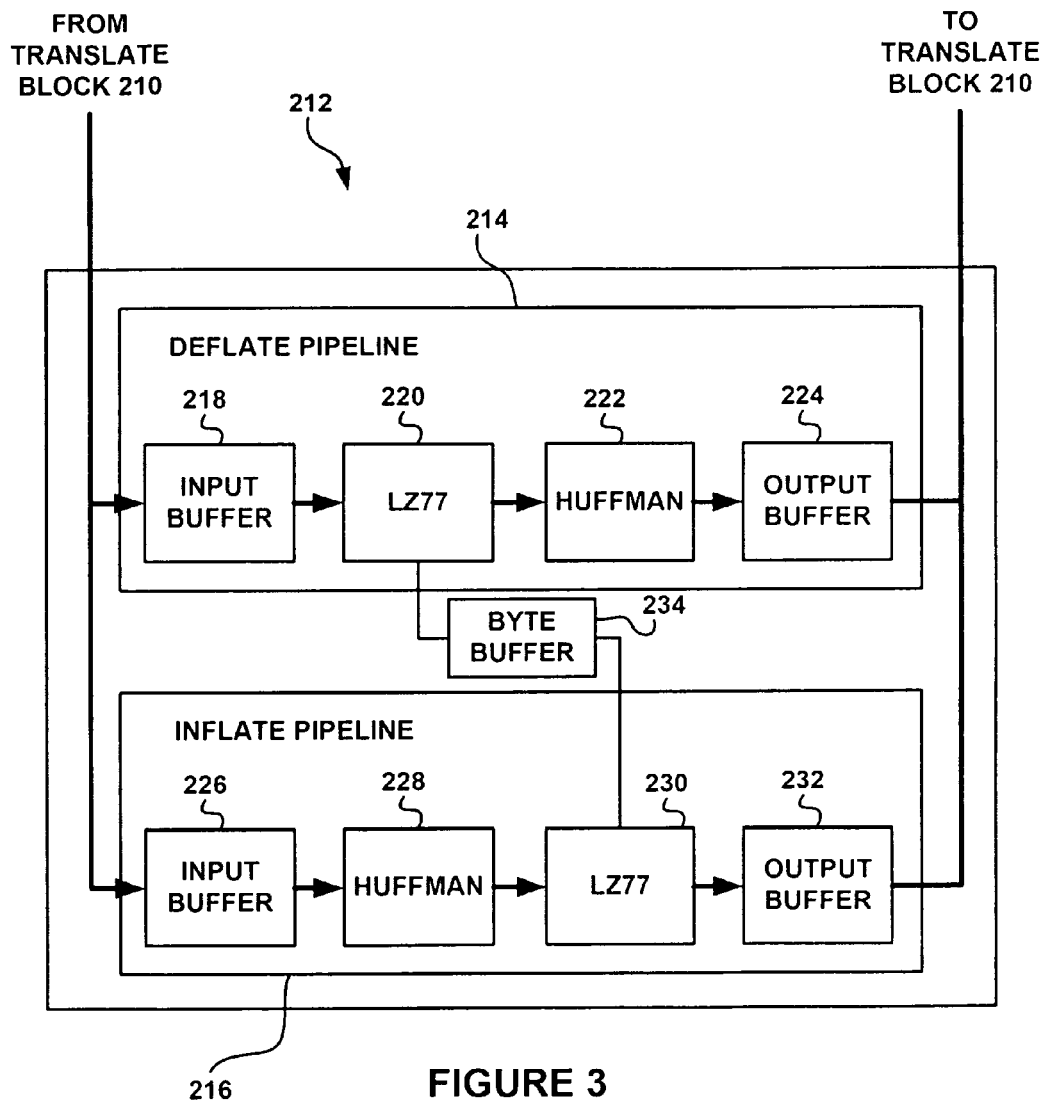
FIG. 3 shows a more detailed diagram of the compression/decompression engine (CDE) shown in FIG. 2, in accordance with one embodiment.

FIG. 3 shows a more detailed diagram of the compression/decompression engine 212 shown in FIG. 2, in accordance with one embodiment. As shown, the CDE 212 may include a deflate pipeline 214 and an inflate pipeline 216. In one embodiment, the deflate pipeline 214 may be utilized to implement the compression process performed by the CDB 202, also referred to as the deflate process. As shown, the deflate pipeline 214 may include an input buffer 118, LZ77 logic 220, Huffman logic 222, and an output buffer 224.

In another embodiment, the inflate pipeline 216 may be utilized to implement the decompression process performed by the CDB 202, also referred to as the inflate process. As shown, the inflate pipeline 216 may include an input buffer 226, Huffman logic 228, LZ77 logic 230, and an output buffer 232. Although each pipeline is shown with individual schematic components, at least some of the components may operate in conjunction with both pipelines 214 and 216 using a single implementation. Other embodiments of the CDE 212 may include fewer or more components.

For both the deflate pipeline 214 and the inflate pipeline 216, the CDE 212 may support various operating modes, including static compression, dynamic compression, and no compression. In one embodiment, a file (e.g., a data file, etc.) may be split into blocks, where each block may use any of the three modes. Hence, the various blocks of a single file may be compressed using any combination of these three modes.

For the deflate process, splitting the file into blocks may be performed as a pre-process before the file is presented to the CDB 202 and/or the CDE 212. The CDB 202 may then compress each block and use bit-stitching to recombine the compressed blocks in the deflated bit stream. For the inflate process, the deflated bit stream may be input to the CDB 202 and the CDB 202 may decompress the blocks individually. As an option, the CDB 202 may decompress the blocks individually according to block header information within the bit stream.

In one embodiment, the deflate and inflate processes may each use two algorithms to achieve compression. For example, an LZ77 algorithm, implemented by the LZ77 logic 220 for the deflate process, may create a dictionary of strings of bytes that have occurred previously in the file. In one embodiment, the LZ77 logic 220 may enforce a minimum string length (e.g. three bytes, etc.) for the byte strings in the dictionary. The LZ77 logic 220 may then replace strings with a distance value (e.g. up to 32,768 bytes, etc.) and a length value (e.g. up to 258 bytes, etc.) for a matching string. If no match exists, then the incoming byte may be output as a literal character.

Further, the Huffman logic 222 (for the deflate process) may implement a Huffman algorithm to replace the literal, length, and distance codes with codes whose length depends on the frequency of occurrence of the LZ77 codes in the block. In one embodiment, the Huffman logic 222 may implement one of three coding modes. For example, the Huffman logic 222 may implement static compression, dynamic compression, and no compression.

For static compression, a predefined code may be used. Static compression coding may be executed relatively quickly. Dynamic compression coding may use one pass to create a statistics table of the frequency of occurrence of each LZ77 code and to generate an optimized Huffman code, and a second pass to make use of the Huffman code to encode the LZ77 data. In this way, a high compression ratio may be achieved.

Regardless of whether dynamic or static compression is implemented, the Huffman logic 222 may output a serial bit stream which may be sent a byte at a time to the XLT 210. In some embodiments, the bit stream may be packed with zeros at the end of the file in order to finish on a byte boundary. As one example, the maximum transfer rate may be approximately 3.2 Gbps at 400 MHz, although other levels of performance may be achieved using other systems.

As a more detailed example of the static compression mode, the Huffman logic 222 may parse the LZ77 compressed data, replacing symbols with equivalent Huffman codes and extra length and distance bits. More specifically, a static lookup table (LUT) may be built upon initialization, where the LUT may be used to provide a Huffman code for every literal, length, or distance subsequently presented to it. In some embodiments, there may be thirty distance codes, each having five bits.

Additionally, literal and length codes may be part of the same LUT (e.g. a 286-entry LUT, etc.) or part of a separate LUT. In one embodiment, each literal and length code may be seven, eight, or nine bits in size. Furthermore, many of the length and distance codes may have extra data which follows directly after the code word, which provides a range of possible lengths or distances. The extra bits may also be used to define an exact length or distance. However, the number of extra bits may be a function of the code, with longer codes having more extra data values. The Huffman logic 222 may then output the deflated block, including the compressed data and other symbols.

With further reference to the dynamic compression mode, in one embodiment, the Huffman logic 222 may implement multiple phases. For example, two phases may be implemented for dynamic Huffman coding. In the first phase (i.e. the first pass), the Huffman logic 222 may gather statistics for each literal/length code (e.g. 286 codes in a 286-entry LUT, etc.). The Huffman logic 222 may also gather statistics for each distance code (e.g. 30 distance codes, etc.).

In the second phase (i.e. the second pass), several operations may be implemented. In one embodiment, a literal and length heap may be built, and a literal and length Huffman tree may be built. Further, the literal and length Huffman code may be generated. Similar heap, tree, and code generation operations may also be implemented for the corresponding distance value and the bit length.

Subsequently, the Huffman logic 222 may output the bit length code sizes, the literal/length codes using the bit length code, and the distance code using the bit length code. In one embodiment, the Huffman logic 222 may parse the literal/length and distance Huffman codes, replacing code lengths and repetition counts with equivalent bit length Huffman codes. Similarly, the Huffman logic 222 may parse the LZ77 compressed data, replacing symbols with equivalent Huffman codes and extra length and distance bits. The output literal/length codes and distance codes are also referred to as the output bit stream.

It should be noted that some input files, or data such as embedded image data within a file, may already be in a compressed format. As a result, the static and dynamic coding techniques of the Huffman logic 222 may be unable to compress such data further without potentially increasing the size of the compressed data. For these types of input files, the Huffman logic 222 may implement a format without further compression (i.e. the "no compression mode"). In this mode, the data may be split into blocks, with each block being up to a defined number of bytes in size (e.g. 65,535 bytes). The compression process may also add a header for this data type and output the data stream as configured.

In general, the inflate process is the reverse of the deflate process. However, in some cases, additional functionality may be implemented in one process and not the other. For example, some embodiments of the inflate process may be configured to process any valid compressed file, including the possibility of unlimited block size as well as distances and lengths up to the maximums specified in the industry standards.

Within the inflate process, the Huffman logic 228 may receive data from the XLT 210 via the input buffer 226. In some embodiments, the Huffman logic 228 may operate in a single phase, regardless of whether the data is statically or dynamically encoded. For static decoding, the LUT may be programmed during initialization. As an option, a set of comparators may be used to determine the length of each incoming literal/length code, which may be a specified number of bits (e.g. 7, 8, or 9 bits, etc.).

In one embodiment, the distance codes may all be five bits in length. However, other embodiments may use different bit lengths for the literal/length and/or distance codes. An offset may then be added to the code to put it into the correct range within the LUT. The output of the LUT may provide both the value of the code and the length of any extra data that is appended.

In contrast to the LUT for the static decoding, the dynamic LUT may be programmed on demand. In some embodiments, the Huffman logic 228 may read and store the size (e.g. 1-7 bits, etc.) of each bit length code and determine the sum of codes of each size for the bit length codes. The Huffman logic 228 may also determine the start code for each code size for the bit length codes. The Huffman logic 228 may then write the bit length LUT.

Using the bit length LUT, the Huffman logic 228 may read and store the size (e.g. 1-15 bits, etc.) of each literal/length code and determine the sum codes of each size for the literal/length codes. The Huffman logic 228 may also determine the start code for each code size for the literal/length codes. The Huffman logic 228 may then write the literal/length LUT.

The Huffman logic 228 may also use the bit length LUT to read and store the size (e.g. 1-15 bits, etc.) of each distance code and to determine the sum of codes of each size for the distance codes. The Huffman logic 228 may also determine the start code for each code size of the distance codes and then write the distance LUT.

Like the static LUT, a set of comparators may be used to determine the size of each incoming literal/length and distance code. In one embodiment, fourteen comparators may be used, in the case that the size varies from 1 to 15 bits. Other embodiments may use other quantities of comparators.

The output of the LUT may give both the value of the code and the length of any extra data that is appended. Together the code and extra data may be used to recover the length or distance value. In some embodiments, literals may be treated like lengths but have no extra data. In this way, the original LZ77 sequence may be recovered and output to the LZ77 logic 230 of the inflate pipeline 216.

The LZ77 logic 230 may then reconstruct the original file data and send the original file data via the output buffer 232 to the XLT 210. In one embodiment, the LZ77 logic 230 may use the same buffer (e.g. a 32 Kbyte buffer, etc.) used by tile LZ77 logic 220 of the deflate pipeline 214. In this case, the LZ77 logic 230 may use the buffer as the source of the strings specified by the distance and length codes provided by the Huffman logic 228 of the inflate pipeline 216. Each decoded byte may be output to the XLT 210 and written to the buffer. In this manner, the previous set number of bytes of data (e.g. 32 Kbytes of data, etc.) may always be available for reference.

In one embodiment, the CDB 202 may be designed to perform either deflate or inflate sequentially, not both at once. To make it easier to deal with long files which could provide a bottleneck, the CDB 202 architecture may allow a "context save" to be performed, followed at some arbitrary time later by a "context restore" in order to continue (or complete) the stream.

For deflate, the CPU may divide the blocks and decide the type of encoding to use for each block (e.g. static, dynamic, or non-compressed). The CPU may also decide where to switch to another stream. In one embodiment, the switch may occur at a block boundary. In this way, the CDB 202 and/or the XLT 210 may save a bit position and partial byte data for bit-stitching the blocks together.

In one embodiment, a save operation during the deflate process may be performed at block boundaries of the file. For dynamic blocks, saves may always occur at the end of the second pass. In another embodiment, a save and restore during the deflate process may always occur on block boundaries, with no special processing by the CDE 212 being implemented.

In the case that a save occurs on a block boundary, current dynamic Huffman code does not need to be reloaded. Further, as an option, distance codes may not be allowed to straddle blocks. Thus, the buffer does not have to be re-initialized with warm-up data (i.e. data for initializing the buffer). In this way, apart from some context for bit-stitching by the XLT 210, the restore may look similar to the beginning of any other block.

With respect to implementing a save operation during the inflate process, context may be saved for reloading the dynamic Huffman tables, re-initializing the buffer (e.g. the 32 K-byte buffer), and for continuing the decoding of the bit stream from where the decoding was interrupted. To enable reloading the Huffman tables in the case of a dynamic Huffman coding, the inflate pipeline 216 may send out any Huffman preamble the inflate pipeline 216 receives to the XLT 210 to store in a scratch page for later recovery. In some cases, the only difference in the bit stream that the inflate pipeline 216 receives and the output bit stream, is that the output preamble may start out byte aligned.

Additionally, in some cases, the output preamble may be partial data because the save may occur while the preamble is being received. In that situation, a bit in a context word may indicate that the preamble was partial. In this case, the feedback data may be sent via the deflate output buffer 232.

In one embodiment, the XLT 210 may save pointers to the previous 32 K-bytes of the inflated buffer data in the scratch page so that on restore the data may be retrieved to allow the buffer to be re-initialized. Additionally, an 8-byte context word may be created which allows the input stream state to be recovered, such that the inflate process may later continue from where the process was interrupted. In this case, the CPU may not have any information about the incoming stream, with the exception of the amount of data that has been received.

Because of the Huffman coding, the CPU may not be able to distinguish the location of the block boundaries. Thus, a context save may occur anywhere in the bit stream, either in the preamble data, or in the compressed data itself. Save logic may be utilized to resolve every eventuality.

To accomplish this, the save logic may maintain a save buffer (e.g. a 6-byte buffer, etc.) which holds the last N bytes (e.g. 6 bytes, etc.) of incoming inflate data and a counter which determines how many of these bits (e.g. 48 bits, etc.) have been committed by being sent to the LZ77 logic 230 and accepted. In some cases, sending a length code without a distance code may be no value to the LZ77 logic 230. Thus, if the stream stops without a complete length plus distance, then the save count may include both code lengths until the distance code is accepted.

Similarly, there may be no way of knowing whether there are sufficient bits to perform a look-up in the Huffman LUT unless the LZ77 logic 230 has the full number of bits expected (e.g. the 7 or 15 bits expected). If the LZ77 logic 230 does not have the full number of bits expected, the logic may not attempt the look-up and all the remaining bits may be saved. In one embodiment the total number of saved bits may include 15 bits for the length code, 15 bits for the distance code, a maximum of 5 bits of length extra data and a maximum of 13 bits of distance extra data, less one bit (thereby preventing the look up) a total of 47 bits.

In one embodiment, a save during the inflate process may be performed each time a dynamic inflate preamble is received. In this case, the preamble data may be sent to the pipeline output buffer 232, where the data is sent back to the XLT 210. As an option, the saved preamble may be byte-aligned at the beginning, whether or not the incoming data is aligned.

Subsequently, if a save is requested, two cases may be handled. For example, if the save request follows the preamble, then the XLT 210 has already received and stored the entire preamble (i.e. a full save). If a save is requested during the preamble, then a partial save results. In either case, the CDB 202 may send a context word (e.g. an 8-byte context word) which contains any fragmentary data remaining (up to 47 bits), the length of the fragmentary data (as a bit count), the state of the inflate pipeline 214, the type of data (dynamic, static, or non-compressed), and a bit to distinguish the full and partial save types.

With respect to the inflate process, the restore begins by sending restore data. The XLT 210 may use a data type indication which may indicate normal, restore, or warm-up data. The restore data may be treated much like normal data except it will be known that only the LUTs are beings programmed and compressed data should not be expected. If the save was partial, the restore may run out of restore data before the LUTs are fully programmed, and may have to continue programming them when the normal data is received.

The XLT 210 may then send the warm-up data to re-initialize a 32-kbyte Byte Buffer 234. It should be noted that, although the Byte Buffer 234 is shown as part of the CDE 212, in another embodiment the Byte Buffer 234 may be separate from the CDE 212. For example, in one embodiment the Byte Buffer 234 may be included as part of the CDB 202.

The warm-up data may be sent much like the normal inflate data, however with a different data type indication. The deflate pipeline 214 will recognize this data type, and put the data in the Byte Buffer 234 in the same way it would for normal deflate data but without doing any deflate operations. At the end of the warm up data, the XLT 210 may make a restore request which causes the context word (e.g. the 8-byte word) to be read back and the input buffer 226 and an inflate state to be reset to a state that was present before the save occurred.

Finally, the XLT 210 will be ready to send normal data. The CDE 212 will either continue programming the LUTs if the save was partial, or begin looking up codes if the save was full. At this point, the input buffer 226 could be empty or there may still be data waiting to be processed. However full the input buffer 226 may be, there should still be room for the maximum 47 bits of restore data to be added without it overflowing. In one embodiment, for each compression type, a maximum of 8 bytes may be stored in the input buffer. This is sufficient because in the worst case the buffer will have at most 17 bits of data (i.e. 17 bits of data representing a static distance code of 5 bits plus 13 bits of extra data, less one bit, which prevents the distance code from being looked up).

Whether a full or partial restore was performed, the CDB 202 will continue from where it was halted. It should be noted that the CDB 202 receives only data to be deflated or the bit stream data portion of packets to be inflated. In one embodiment, header information and cyclic redundancy check (CRC) data may be stripped (e.g. by software) from inflate packets before sending the raw inflate data to the CDB 202.

Whether deflating or inflating, data may be sent to a CRC block within the CDB 202 which computes both an Adler checksum and a CRC value. These checksums may then be written to the scratch space and may be available for software to either append to a deflate packet or compare with an inflate packet checksum.

Figure 4:
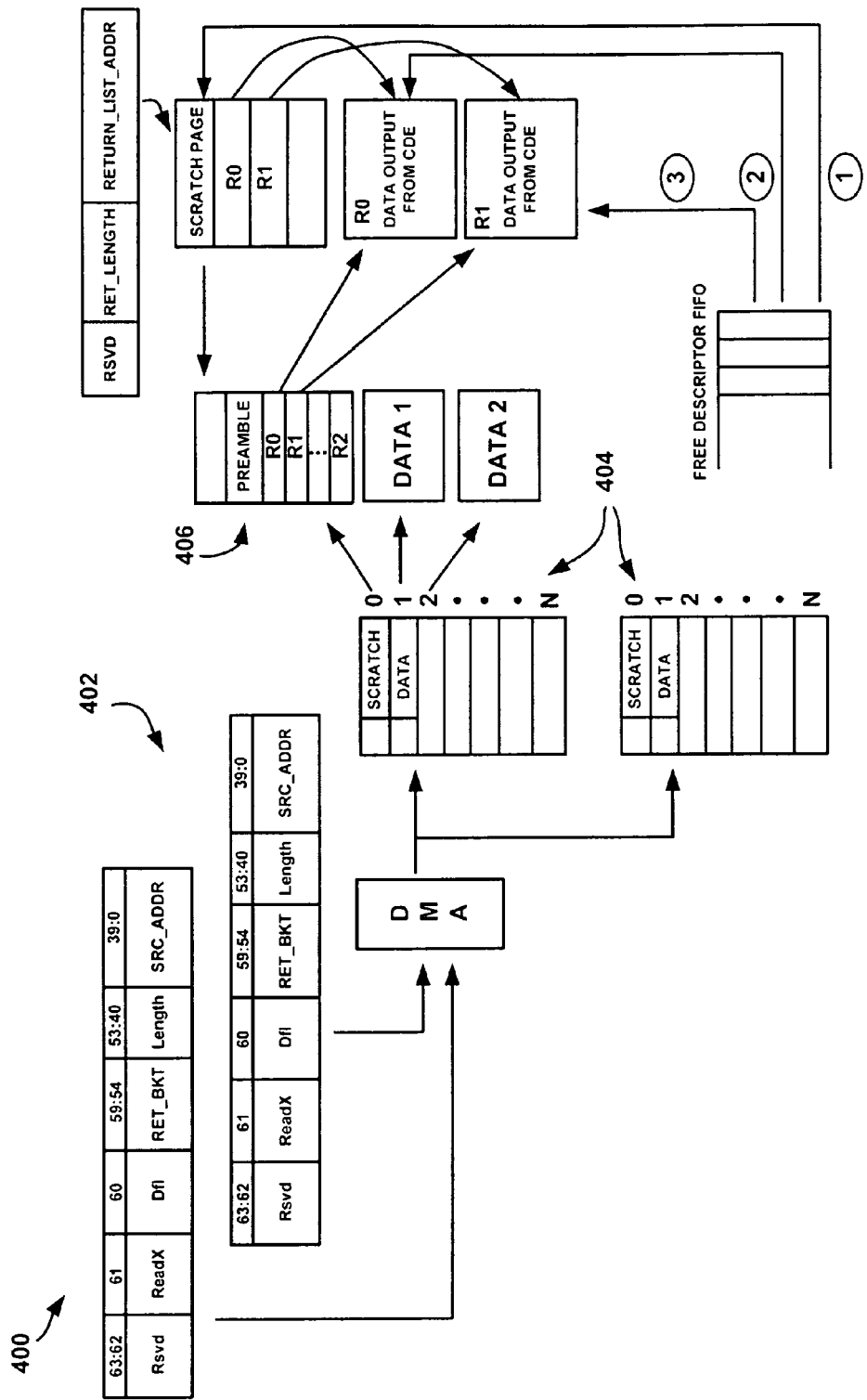
FIG. 4 shows a method for saving and restoring a compression/decompression state, in accordance with another embodiment.

FIG. 4 shows a method 400 for saving and restoring a compression/decompression state, in accordance with another embodiment. As an option, the present method 400 may be implemented in the context of the functionality and architecture of FIGS. 1-3. Of course, however, the method 400 may be implemented in any desired environment. Again, the aforementioned definitions may apply during the present description.

In operation, data is processed by compressing or decompressing the data. In this case, the processing may be facilitated by communication of one or more messages 402, including various information, from a CPU to a compression/decompression block. Table 1 shows various information that may be included in the message 402, in accordance with one embodiment.

TABLE 1

| Bits  | Field    | Description                     |
|-------|----------|---------------------------------|
| 63:62 | Rsvd     | RESERVED                        |
| 61    | ReadX    | Read Exclusive bit              |
| 60    | Dfl      | 1 = Deflate                     |
|       |          | 0 = Inflate                     |
| 59:54 | RET_BKT  | Buckets per CPU                 |
|       |          | 0-7: cpu0                       |
|       |          | 8-15: cpu1                      |
| 53:40 | Length   | Number of descriptors in memory |
| 39:0  | SRC_ADDR | Pointer to list of descriptors  |

In this case, the SRC_ADDR field may point to a list of descriptors in memory. Table 2 shows a list of descriptors in accordance with one embodiment. Table 3 shows definitions for the descriptors in Table 2.

Once received, the message 402 may then be decoded and a list or data structure 404 including data pointers may be retrieved from memory using a DMA operation. As shown, a first pointer in the data structure 404 points to a scratch page 406. Additionally, the data structure 404 and/or the scratch page 406 may include a preamble of the data. In this case, the preamble may include information associated with the data. Further, the preamble may include a last-received preamble.

The scratch page 406 may be utilized to store intermediate results of the compression/decompression. For example in case of decompression, the scratch page may store R0-RN, which are pointers to the decompressed data output from the CDE. In this way, a state of the processing may be saved in the scratch page 406. The data structure 404 may contain pointer to this scratch page in the first entry of the list. In one embodiment, the state of the processing may be saved so that other data can be processed. In this case, the state of the processing may be restored once the other data is processed.

As an option, the state of the processing may be restored utilizing a direct memory access operation. As another option, the data structure 404 may further include error correction information. In one embodiment, the error correction information may be utilized in conjunction with processing the data.

With reference to Table 2, if the "Restore" bit is set then the first pointer is associated with the scratch page 406. In this case, the scratch page 406 may hold data used by the compression/decompression block to store or retrieve intermediate results. In various embodiments, intermediate results may be a partial CRC, a partial Adler checksum, and/or dynamic Huffman codes.

As an option, the next set of descriptors following the scratch page descriptors may be associated with warn up data. This data may be used by the compression/decompression block for warming up a dictionary (e.g. a buffer, etc.) associated with tile block. The SOD (Start of Data) bit may be set for the page where the first data starts.

TABLE 2

| EOF | Type1 | Type0 | SOD | SOB | Save | Restore | EOB | Length         | Address          | Description                     |
|-----|-------|-------|-----|-----|------|---------|-----|----------------|------------------|---------------------------------|
| 63  | 62    | 61    | 60  | 59  | 58   | 57      | 56  | 55:40          | 39:0             | Bit position in a 64 bit descriptor |
| 0   | 0     | 0     | 0   | 0   | 0    | 1       | 0   | Length_SCRATCH | SCRATCH_PAGE_ADDR | First descriptor points to scratch page |
| 0   | 0     | 0     | 0   | 1   | 0    | 0       | 0   | Length_W0      | ADDR_W0          |                                 |
| 0   | 0     | 0     | 0   | 0   | 0    | 0       | 0   | Length_W1      | ADDR_W1          |                                 |
| 0   | 0     | 1     | 1   | 1   | 0    | 0       | 0   | Length_0       | ADDR_0           | Huffman Block 1                 |
| 0   | 0     | 1     | 0   | 0   | 0    | 0       | 1   | Length_1       | ADDR_1           | Huffman Block 1                 |
| 0   | 1     | 0     | 0   | 1   | 0    | 0       | 0   | Length_2       | ADDR_2           | Huffman Block 2                 |
| 0   | 1     | 0     | 0   | 0   | 0    | 0       | 1   | Length_3       | ADDR_3           | Huffman Block 2                 |
| 0   | 0     | 0     | 0   | 1   | 0    | 0       | 0   | Length_4       | ADDR_4           | No Compression Block            |
| 1   | 0     | 0     | 0   | 0   | 0    | 0       | 1   | Length_5       | ADDR_5           | No Compression Block            |

TABLE 3

EOF - End Of File
{Type1, Type0} - Useful for deflate. For inflate, the incoming data has to be decoded to determine the Block type.
  00 - No Compress Block
  01 - Static Huffman
  10 - Dynamic Huffman - pass 1
  11 - Dynamic Huffman - pass 2
SOD - Start of Data
SOB - Start of Block. Useful for deflate.
Save - Save Context. This may be set only on the last entry of the descriptor List.
Restore - Restore Context. This may be set only on the First entry of the descriptor list.
EOB - End of Block. Useful for deflate.

For dynamic deflate the descriptors may have to be repeated twice. In this case, all descriptors starting with the Start of Block (SOB) and ending with End of Block (EOB) of each dynamic deflate may be repeated in the same sequence. The last descriptor in the list may or may not have the SAVE bit set. If the SAVE bit is set, the intermediate results may be stored back into the SCRATCH_PAGE_ADDR.

Figure 5A:
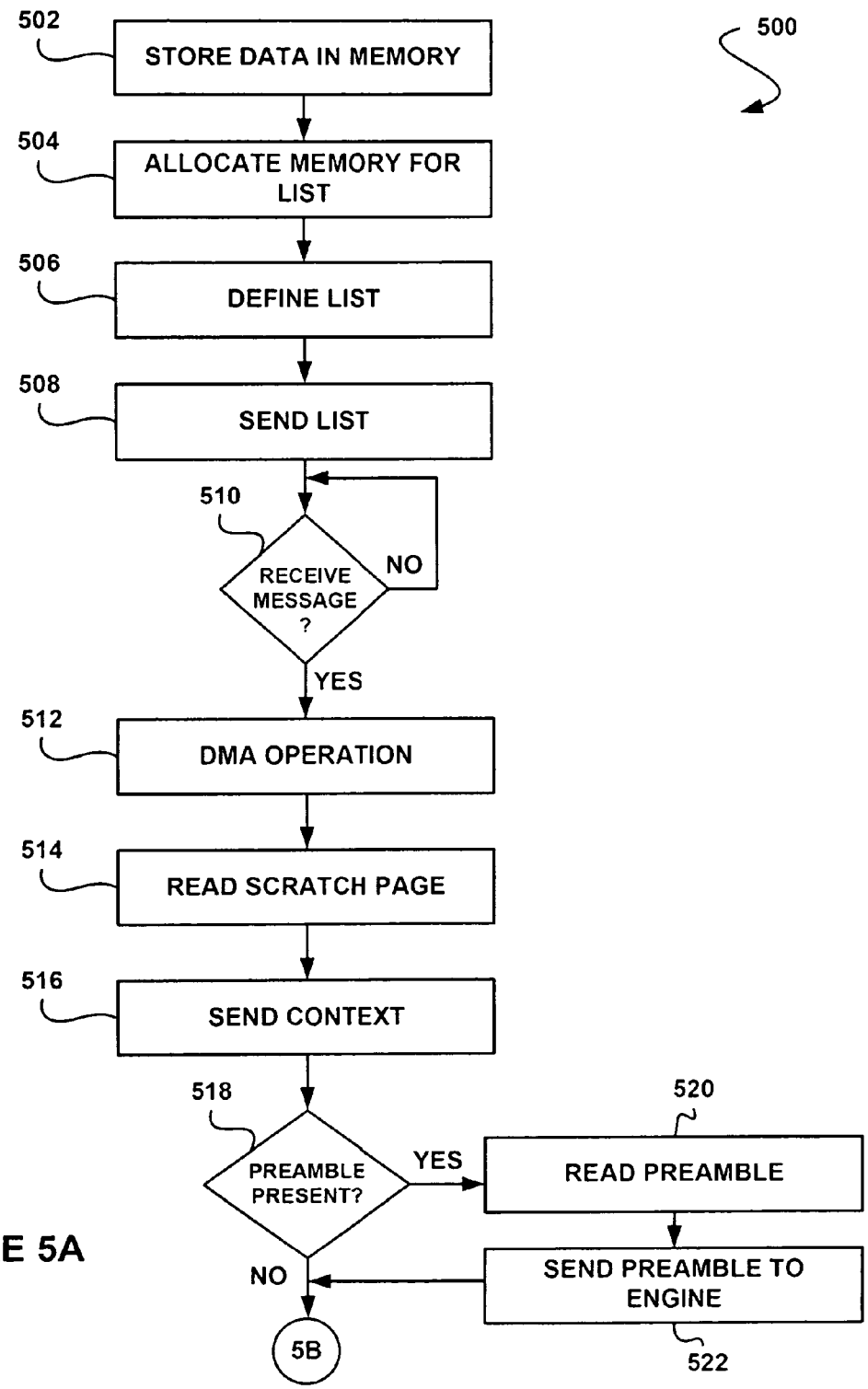
FIGS. 5A-5C show a method for saving and restoring a compression/decompression state, in accordance with another embodiment.
Figure 5B:
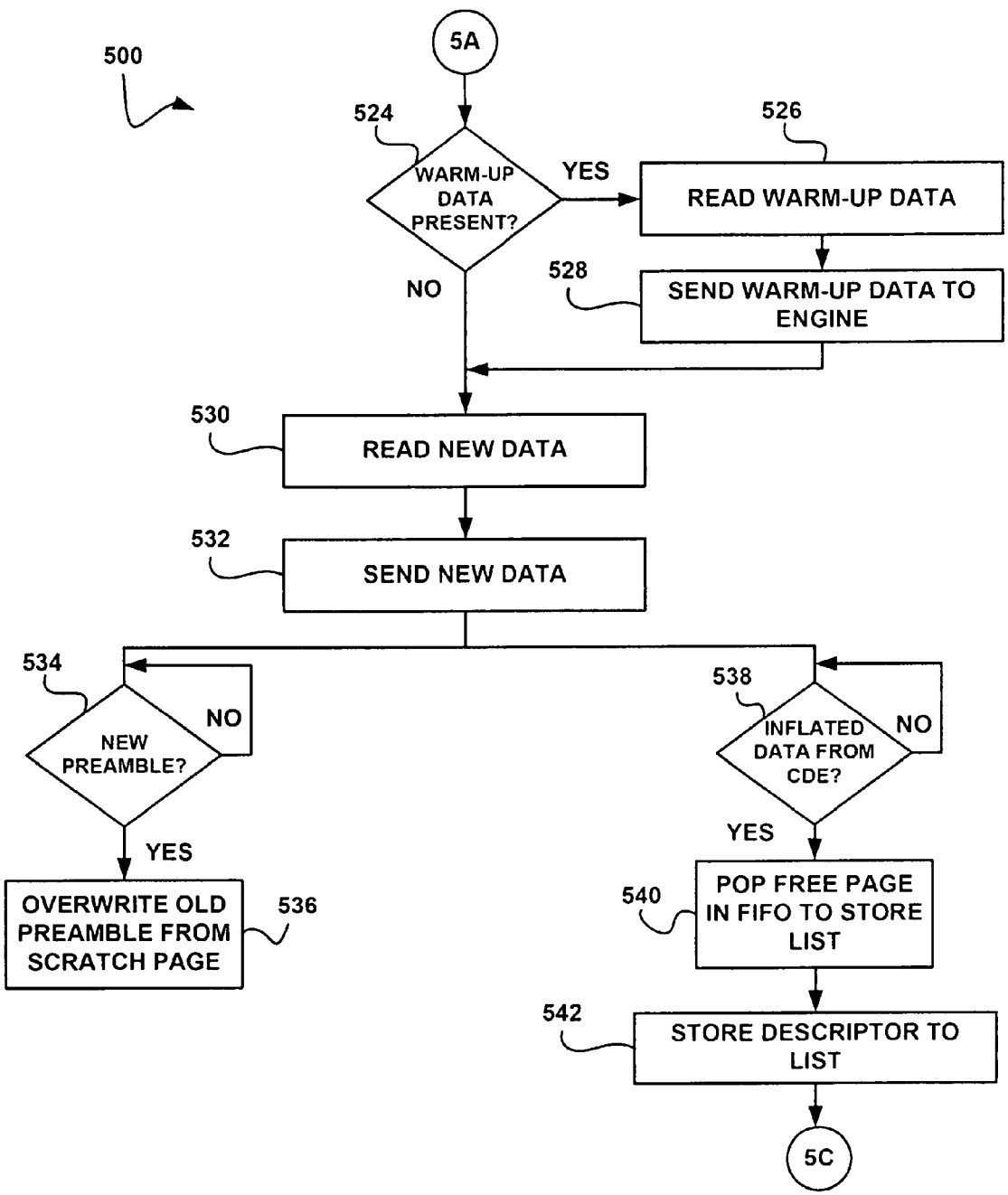
Figure 5C:
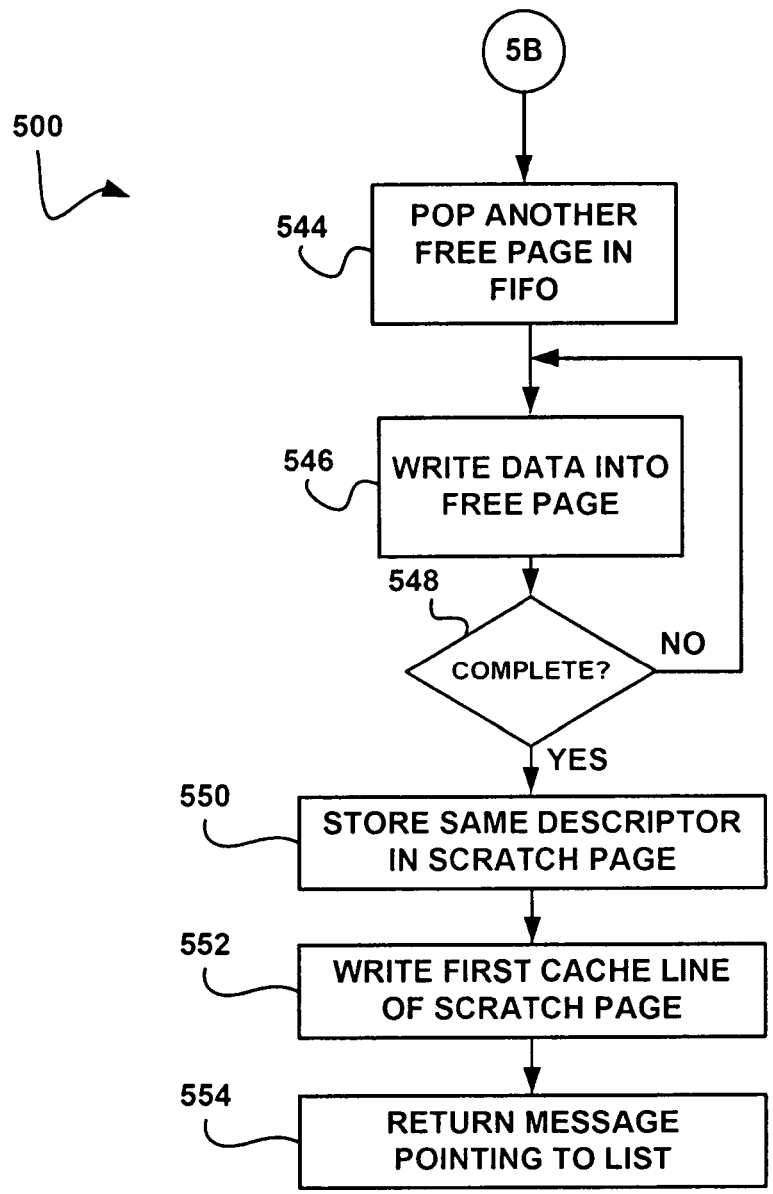

FIGS. 5A-5C show a method 500 for saving and restoring a compression/decompression state, in accordance with another embodiment. As an option, the present method 500 may be implemented in the context of the functionality and architecture of FIGS. 1-4. Of course, however, the method 500 may be carried out in any desired environment. Further, the aforementioned definitions may apply during the present description.

As shown, data is stored in memory. See operation 502. Further, memory is allocated for a list (i.e. a data structure). See operation 504. In one embodiment, the memory may be allocated by a CPU.

Additionally, the list is defined. See operation 506. In one embodiment, defining the list may include setting a first entry in the list equal to a scratch page. In another embodiment, defining the list may include setting a plurality of entries equal to the data. For example, the list may include a first entry "0" pointing to the scratch page and a plurality of entries "1 through N" pointing to data entries.

Once the list is defined, the list is sent to a compression/decompression block (CDB). See operation 508. In this case, the list or information pointing to the list may be included in a message that is sent. In one embodiment, the list may be sent utilizing the CPU.

Once the message is sent to the CDB, it is determined whether the message is received by the CDB. See operation 510. In various embodiments, the message may be received utilizing a variety of devices. For example, in one embodiment, the message may be received using a bus interface unit and/or a translate block as illustrated in FIG. 2. Furthermore, the message may be different formats in various embodiments.

If it is determined that a message is received, a DMA operation is performed. See operation 512. Further, a scratch page associated with the message is read. See operation 514. Once the scratch page is read, a context associated with the scratch page/list is sent. See operation 516. In one embodiment, the context may be sent to a compression/decompression engine.

Once the context is sent, it is determined whether a preamble is present in the scratch page (e.g. see the scratch page 406 of FIG. 4). See operation 518. If a preamble is present, the preamble is read and the preamble is sent to the compression/decompression engine. See operations 520 and 522. In this case, the preamble may be read using a DMA read.

Further, it is determined whether warm-up data is present. See operation 524 of FIG. 5B. In this case, the warm-up data may refer to the entries R0-RN shown in the scratch page 406 of FIG. 4. If warm-up data is present, the warm-up data is read and the warm-up data is sent to the compression/decompression engine. See operations 526 and 528. In this case, the warm-up data may be read using a DMA read. Additionally, the warm-up data may include any data that is pointed to by descriptors included in the list.

It should be noted that operations 518 through 528 occur when a restore process is being implemented. In the case that a restore is not being implemented, such operations may be omitted. In one embodiment, a bit may be included in the message indicating whether a restore process is to be implemented.

Once the warm-up data is read, new data is read and sent. See operations 530 and 532. In this case, the new data refers to data that has not yet been read. For example, the new data may be data associated with a new message. Once the new data is read, it is then determined whether the new data includes a new preamble. See operation 534. If a new preamble is present, the old preamble is overwritten in the scratch page. See operation 536.

Additionally, it is determined whether inflated data from the compression/decompression engine is present. See operation 538. As shown, determining whether inflated data is present may occur in parallel with operations 534 and 536.

If inflated/deflated data is output from the CDE, a free page is popped out of a buffer (e.g. a FIFO) to store the list. See operation 540. Further, a descriptor is stored to the list. See operation 542. In this case, the descriptor may include an address of the last free page popped from the buffer.

In addition, if inflated/deflated data is output from the CDE, another free page is popped in the buffer. See operation 544 of FIG. 5C. The data is then written into the free page. See operation 546. It is then determined whether all the data is written and/or whether the page is full. See operation 548. If the page is full, another free page is popped and the data is written to this new page.

Further, the same descriptors stored to the list are stored in the scratch page. See operation 550. Still yet, a first cache line of the scratch page is written. See operation 552. In this case, data written to the first line of the scratch pace may include information indicating whether the list is associated with a save or restore operation. Additionally, the data written to the first line of the scratch page may include CRC data and/or an Adler checksum. Once the first cache line of the scratch page is written, the message is returned, the message pointing to the list. See operation 554.

In this way, a save and restore feature may be implemented, which allows the intermediate state information of a first file being processed to be stored and allows work on a second file to proceed. While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
    using a processor to perform compression or decompression of a first incoming file;
    pausing the compression or decompression of the first incoming file by saving a state of processing in a memory;
    compressing or decompressing a second incoming file on a different stream than the first incoming file while the compression or decompression of the first incoming file is paused, wherein the first incoming file and the second incoming file are bit stream data arriving sequentially on a processing list; and
    in response to receiving a remainder of the first incoming file, restoring the state to resume the compression or decompression of the first incoming file for the remainder of the first incoming file.

2. The method of claim 1, wherein the state of the processing is stored in a data structure.

3. The method of claim 2, wherein the data structure includes error correction information.

4. The method of claim 2, wherein the data structure includes a preamble of data associated with the first incoming file.

5. The method of claim 4, wherein the preamble includes a last-received preamble.

6. The method of claim 2, wherein the data structure includes pointers to data associated with the first incoming file.

7. The method of claim 1, wherein the state of the processing is restored utilizing a direct memory access operation.

8. The method of claim 1, wherein at least a portion of the saving and at least a portion of the restoring are carried out simultaneously.

9. The method of claim 1, wherein the state of the processing is restored once the second incoming file is processed.

10. The method of claim 1, wherein the first incoming file is associated with a first stream and the second incoming file is associated with a second stream.

11. A system, comprising:
    a processor to compress or decompress a first incoming file;
    a memory to save a state of processing when pausing compression or
    decompression of the first incoming file; and
    the processor to compress or decompress a second incoming file on a different stream than the first incoming file while the compression or decompression of the first incoming file is paused and to restore the state to resume compression or decompression of a remainder of the first incoming file in response to receiving the remainder of the first incoming file, wherein the first incoming file and the second incoming file are bit stream data arriving sequentially on a processing list.

12. The system of claim 11, wherein the state of the processing is stored in a data structure.

13. The system of claim 12, wherein the data structure includes error correction information.

14. The system of claim 12, wherein the data structure includes a preamble of data associated with the first incoming file.

15. The system of claim 14, wherein the preamble includes a last-received preamble.

16. The system of claim 12, wherein the data structure includes pointers to the data associated with the first incoming file.

17. The system of claim 11, wherein the state of the processing is restored utilizing a direct memory access operation.

18. The system of claim 11, wherein at least a portion of the saving and at least a portion of the restoring are carried out simultaneously.

19. A computer program product embodied on a non-transitory computer readable medium, the non-transitory computer readable medium having stored thereon a sequence of instructions which, when executed by a processor, causes the processor to execute a process, the process comprising:

performing compression or decompression of a first incoming file;

pausing the compression or decompression of the first incoming file by saving a state of processing in a memory;

compressing or decompressing a second incoming file on a different stream than the first incoming file while the compression or decompression of the first incoming file is paused, wherein the first incoming file and the second incoming file are bit stream data arriving sequentially on a processing list; and in response to receiving a remainder of the first incoming file, restoring the state to resume the compression or decompression of the first incoming file for the remainder of the first incoming file.

20. The computer program product of claim 19, wherein the state of the processing is restored utilizing a direct memory access operation.

21. The computer program product of claim 19, wherein at least a portion of the saving and at least a portion of the restoring are carried out simultaneously.

* * * * *